United States Patent
Yu et al.

(10) Patent No.: US 11,244,924 B2
(45) Date of Patent: Feb. 8, 2022

(54) TRI-LAYER COWOS STRUCTURE

(71) Applicant: Taiwan Semiconductor Manufacturing Co., Ltd., Hsinchu (TW)

(72) Inventors: Chen-Hua Yu, Hsinchu (TW); Shang-Yun Hou, Jubei (TW); Yun-Han Lee, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/995,080

(22) Filed: Aug. 17, 2020

(65) Prior Publication Data
US 2020/0381392 A1    Dec. 3, 2020

Related U.S. Application Data

(63) Continuation of application No. 16/223,449, filed on Dec. 18, 2018, now Pat. No. 10,748,870, which is a (Continued)

(51) Int. Cl.
*H01L 21/00*    (2006.01)
*H01L 23/00*    (2006.01)
(Continued)

(52) U.S. Cl.
CPC .............. *H01L 24/97* (2013.01); *G05F 3/02* (2013.01); *H01L 21/4846* (2013.01);
(Continued)

(58) Field of Classification Search
CPC ............ H01L 24/97; H01L 23/28; G05F 3/02
See application file for complete search history.

(56) References Cited

U.S. PATENT DOCUMENTS 7,557,440 B2 * 7/2009 Yamamoto ............. H01G 4/236
257/700
7,701,057 B1    4/2010 Rahman et al.
(Continued)

FOREIGN PATENT DOCUMENTS

CN    102394227 A    3/2012
CN    104037153 A    9/2014
(Continued)

*Primary Examiner* — Laura M Menz
(74) *Attorney, Agent, or Firm* — Slater Matsil, LLP

(57) ABSTRACT

A package includes an Integrated Voltage Regulator (IVR) die, wherein the IVR die includes metal pillars at a top surface of the first IVR die. The package further includes a first encapsulating material encapsulating the first IVR die therein, wherein the first encapsulating material has a top surface coplanar with top surfaces of the metal pillars. A plurality of redistribution lines is over the first encapsulating material and the IVR die. The plurality of redistribution lines is electrically coupled to the metal pillars. A core chip overlaps and is bonded to the plurality of redistribution lines. A second encapsulating material encapsulates the core chip therein, wherein edges of the first encapsulating material and respective edges of the second encapsulating material are vertically aligned to each other. An interposer or a package substrate is underlying and bonded to the IVR die.

20 Claims, 11 Drawing Sheets

Related U.S. Application Data continuation of application No. 15/488,933, filed on Apr. 17, 2017, now Pat. No. 10,163,851, which is a continuation of application No. 15/007,714, filed on Jan. 27, 2016, now Pat. No. 9,627,365.

(60) Provisional application No. 62/260,832, filed on Nov. 30, 2015.

(51) Int. Cl.

| | | |
|---|---|---|
| *H01L 21/48* | (2006.01) | |
| *H01L 23/538* | (2006.01) | |
| *H01L 23/522* | (2006.01) | |
| *H01L 25/10* | (2006.01) | |
| *H01L 23/48* | (2006.01) | |
| *G05F 3/02* | (2006.01) | |
| *H01L 23/28* | (2006.01) | |
| *H01L 25/065* | (2006.01) | |
| *H01L 27/06* | (2006.01) | |
| *H01L 27/12* | (2006.01) | |
| *H01L 27/24* | (2006.01) | |
| *H01L 27/28* | (2006.01) | |
| *H01L 49/02* | (2006.01) | |

(52) U.S. Cl.
CPC ............ *H01L 23/28* (2013.01); *H01L 23/481* (2013.01); *H01L 23/5226* (2013.01); *H01L 23/5227* (2013.01); *H01L 23/5389* (2013.01); *H01L 24/25* (2013.01); *H01L 25/0652* (2013.01); *H01L 25/105* (2013.01); *H01L 27/0688* (2013.01); *H01L 27/124* (2013.01); *H01L 27/2481* (2013.01); *H01L 27/283* (2013.01); *H01L 28/10* (2013.01); *H01L 2224/16225* (2013.01); *H01L 2225/0651* (2013.01); *H01L 2225/06541* (2013.01); *H01L 2225/06582* (2013.01); *H01L 2225/107* (2013.01); *H01L 2225/1041* (2013.01); *H01L 2225/1058* (2013.01)

(56) References Cited

U.S. PATENT DOCUMENTS

| | | |
|---|---|---|
| 7,750,459 B2 | 7/2010 | Dang et al. |
| 7,838,424 B2 | 11/2010 | Karta et al. |
| 7,863,742 B2 | 1/2011 | Yu et al. |
| 7,932,601 B2 | 4/2011 | Chang et al. |
| 8,039,303 B2 | 10/2011 | Shim et al. |
| 8,067,308 B2 | 11/2011 | Suthiwongsunthorn et al. |
| 8,217,502 B2 | 7/2012 | Ko |
| 8,252,629 B2 | 8/2012 | Yee et al. |
| 8,269,337 B2 | 9/2012 | Hu et al. |
| 8,361,842 B2 | 1/2013 | Yu et al. |
| 8,415,781 B2 | 4/2013 | Kariya et al. |
| 8,680,647 B2 | 3/2014 | Yu et al. |
| 8,698,317 B2 | 4/2014 | Seo et al. |
| 8,703,542 B2 | 4/2014 | Lin et al. |
| 8,754,508 B2 | 6/2014 | Chen et al. |
| 8,754,514 B2 | 6/2014 | Yu et al. |
| 8,759,964 B2 | 6/2014 | Pu et al. |
| 8,772,151 B2 | 7/2014 | Chen |
| 8,778,738 B1* | 7/2014 | Lin ................... H01L 21/561 438/118 |
| 8,785,299 B2 | 7/2014 | Mao et al. |
| 8,803,306 B1 | 8/2014 | Yu et al. |
| 8,809,996 B2 | 8/2014 | Chen et al. |
| 8,822,281 B2 | 9/2014 | Pagaila et al. |
| 8,829,676 B2 | 9/2014 | Yu et al. |
| 8,846,548 B2 | 9/2014 | Tu et al. |
| 8,877,554 B2 | 11/2014 | Tsai et al. |
| 8,993,377 B2 | 3/2015 | Koo et al. |
| 9,048,222 B2 | 6/2015 | Hung et al. |
| 9,048,233 B2 | 6/2015 | Wu et al. |
| 9,087,835 B2 | 7/2015 | Sutardja et al. |
| 9,543,170 B2 | 1/2017 | Yu et al. |
| 9,627,365 B1* | 4/2017 | Yu .................. H01L 23/5389 |
| 9,633,974 B2 | 4/2017 | Zhai et al. |
| 9,735,134 B2 | 8/2017 | Chen |
| 9,741,689 B2 | 8/2017 | Chang et al. |
| 9,831,224 B2 | 11/2017 | Lin et al. |
| 10,748,870 B2* | 8/2020 | Yu .................... H01L 24/25 |
| 10,970,439 B2* | 4/2021 | Zhou ................. G06F 30/30 |
| 2010/0072961 A1 | 3/2010 | Kosonocky et al. |
| 2011/0291288 A1 | 12/2011 | Wu et al. |
| 2011/0317387 A1 | 12/2011 | Pan et al. |
| 2012/0112352 A1 | 5/2012 | Chi et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0292846 A1* | 11/2013 | Lee ................. H01L 23/49827 257/774 |
| 2013/0307140 A1 | 11/2013 | Huang et al. |
| 2013/0341800 A1 | 12/2013 | Tu et al. |
| 2014/0015122 A1 | 1/2014 | Chou et al. |
| 2014/0045379 A1 | 2/2014 | Chen |
| 2014/0048926 A1* | 2/2014 | Wang .................. H01L 24/11 257/737 |
| 2014/0077356 A1* | 3/2014 | Chen ................... H01L 24/14 257/737 |
| 2014/0183693 A1* | 7/2014 | Tsai ................. H01L 23/5223 257/532 |
| 2014/0187103 A1* | 7/2014 | Chen ................. H01L 25/0657 439/723 |
| 2014/0203429 A1* | 7/2014 | Yu .................... H01L 21/6835 257/737 |
| 2014/0225222 A1* | 8/2014 | Yu ..................... H01L 24/97 257/532 |
| 2014/0252558 A1* | 9/2014 | Yu .................... H01L 23/3192 257/618 |
| 2014/0252597 A1* | 9/2014 | Tsai ................. H01L 23/3171 257/737 |
| 2014/0252601 A1* | 9/2014 | Lu .................... H01L 23/5329 257/737 |
| 2014/0252608 A1* | 9/2014 | Chen .................. H01L 23/481 257/738 |
| 2014/0252646 A1* | 9/2014 | Hung .................. H01L 24/81 257/774 |
| 2014/0262468 A1* | 9/2014 | Chen .................. H01L 21/566 174/262 |
| 2014/0264885 A1* | 9/2014 | Tsai .................... H01L 23/544 257/769 |
| 2014/0264930 A1* | 9/2014 | Yu ..................... H01L 24/13 257/774 |
| 2014/0306355 A1* | 10/2014 | Meyer ................ H01L 24/14 257/778 |
| 2016/0190113 A1* | 6/2016 | Sharan ................ H01L 25/16 257/531 |
| 2016/0358889 A1* | 12/2016 | Lai .................... H01L 21/768 |
| 2018/0226349 A1* | 8/2018 | Yu ..................... H01L 21/565 |
| 2019/0123019 A1* | 4/2019 | Yu ..................... H01L 27/124 |
| 2020/0176346 A1* | 6/2020 | Wu .................... H01L 23/5383 |
| 2020/0381392 A1* | 12/2020 | Yu ..................... H01L 24/25 |
| 2021/0028145 A1* | 1/2021 | Yu ..................... H01L 21/4857 |
| 2021/0202312 A1* | 7/2021 | Yu ..................... H01L 23/522 |
| 2021/0272889 A1* | 9/2021 | Wu .................... H01L 23/49822 |

FOREIGN PATENT DOCUMENTS

| | | |
|---|---|---|
| CN | 105374693 A | 3/2016 |
| KR | 20130018090 A | 2/2013 |
| KR | 20130133166 A | 12/2013 |
| KR | 20150105183 A | 9/2015 |
| KR | 20150106815 A | 9/2015 |

* cited by examiner

TRI-LAYER COWOS STRUCTURE

PRIORITY CLAIM AND CROSS-REFERENCE

This application is a continuation of U.S. patent application Ser. No. 16/223,449, entitled "Tri-Layer COWOS Structure," filed Dec. 18, 2018, which is a continuation of U.S. patent application Ser. No. 15/488,933, entitled "Tri-Layer COWOS Structure," filed Apr. 17, 2017, now U.S. Pat. No. 10,163,851 issued Dec. 25, 2018, which is a continuation of U.S. patent application Ser. No. 15/007,714, entitled "Tri-Layer COWOS Structure," filed Jan. 27, 2016, now U.S. Pat. No. 9,627,365 issued Apr. 18, 2017, which application claims the benefit of the U.S. Provisional Application No. 62/260,832, filed Nov. 30, 2015, and entitled "Tri-Layer COWOS Structure," which applications are hereby incorporated herein by reference.

BACKGROUND

Central Processing Unit (CPU) has high requirement to the Input/output (IO) and the power consumed by the CPU. For example, a CPU may include a plurality of cores, and needs to consume a considerable amount of power. On the other hand, the requirement to the provided power is also high. For example, the power supply voltages need to be very stable. Accordingly, a plurality of voltage regulators may be connected to the same CPU chip to provide power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
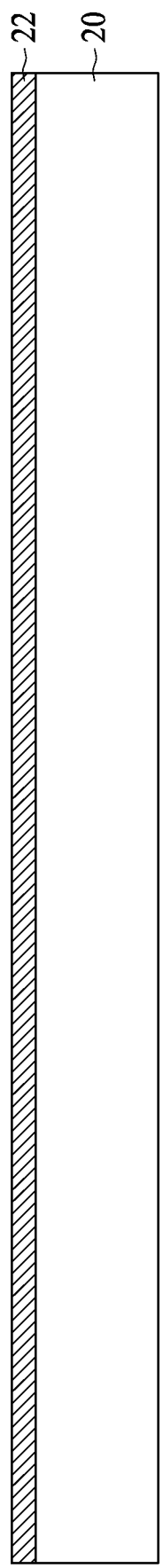
FIGS. 1 through 9 illustrate the cross-sectional views of intermediate stages in the formation of a package including integrated voltage regulators in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multi-tier package and the method of forming the same are provided in accordance with various exemplary embodiments. The multi-tier package may be formed using a Chip-on-Wafer-on-Substrate (CoWoS) process. The intermediate stages of forming the package are illustrated. Some variations of some embodiments are discussed. Throughout the various views and illustrative embodiments, like reference numbers are used to designate like elements.

Figure 11:
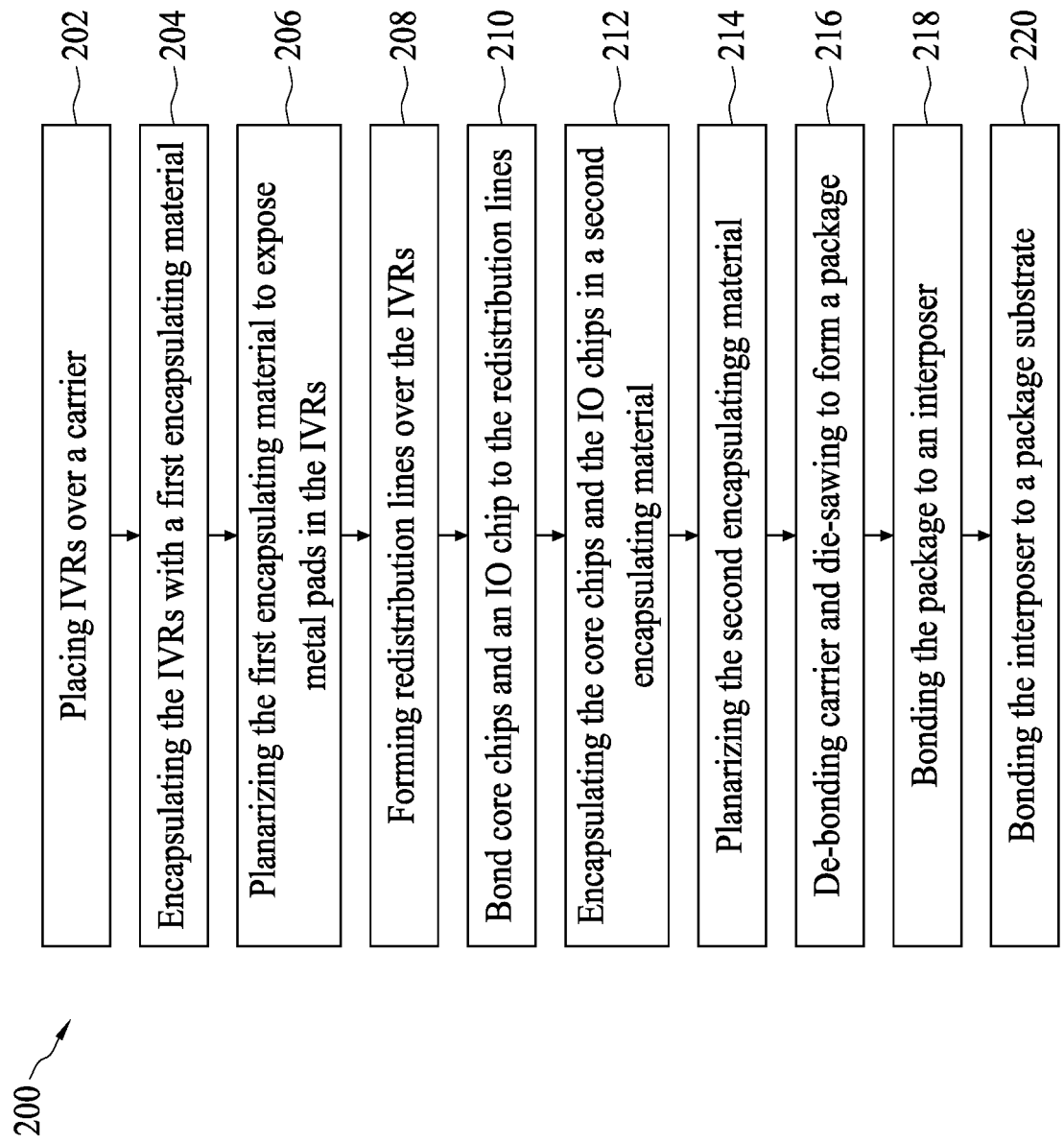
FIG. 11 illustrates a process flow for forming a package in accordance with some embodiments.

FIGS. 1 through 9 illustrate the cross-sectional views of intermediate stages in the formation of a multi-tier package in accordance with some embodiments. The steps shown in FIGS. 1 through 9 are also illustrated schematically in the process flow 200 shown in FIG. 11.

Referring to FIG. 1, carrier 20 is provided, and adhesive layer 22 is disposed over carrier 20. Carrier 20 may be a blank glass carrier, a blank ceramic carrier, an organic carrier, or the like, and may have a shape of a semiconductor wafer with a round top-view shape. Carrier 20 is sometimes referred to as a carrier wafer. Adhesive layer 22 may be formed of a Light-to-Heat Conversion (LTHC) material, for example, and other types of adhesives may also be used. In accordance with some embodiments of the present disclosure, adhesive layer 22 is capable of decomposing under the heat of light, and hence can release carrier 20 from the structure formed thereon.

Figure 2:
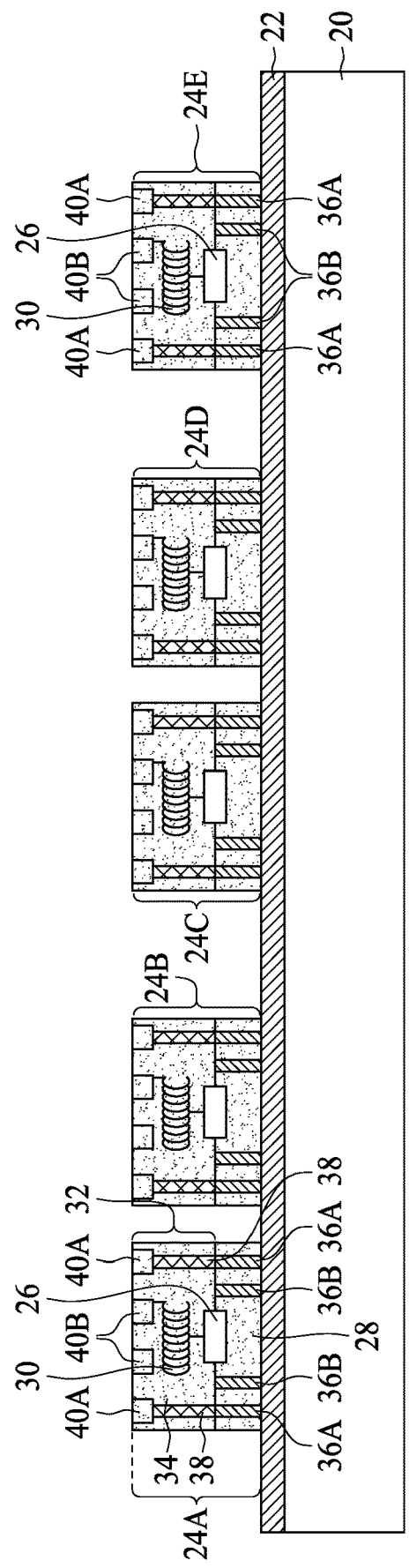

Referring to FIG. 2, device dies 24 (including 24A, 24B, 24C, 24D, and 24E) are placed over adhesive layer 22. The respective step is shown as step 202 in the process flow shown in FIG. 11. Throughout the description, device dies 24 are also referred to as tier-1 dies. It is appreciated that the subsequently discussed process steps are performed at wafer level. Accordingly, there is a plurality of die groups identical to the die group including device dies 24A, 24B, 24C, 24D, and 24E. The plurality of die groups may be arranged as an array including a plurality of rows and a plurality of columns. Device dies 24 may be identical to each other or different from each other. For example, device dies 24A, 24B, 24C, and 24D may be identical to each other, and are different from device die 24E.

In accordance with some embodiments of the present disclosure, device dies 24 are Integrated Voltage Regulator (IVR) dies, which include voltage regulators for regulating voltage supplies for the overlying dies. The circuits in the IVRs are schematically illustrated as 26, which are formed on semiconductor substrate 28. In accordance with alternative embodiments of the present disclosure, device dies 24 include logic dies or memory dies such as Static Random Access Memory (SRAM) dies, Dynamic Random Access Memory (DRAM) dies, or the like.

The IVR circuits 26 may include analog pump circuits, digital control blocks, and other circuits that are used for regulating voltages. The analog pump circuits are used for pumping currents into, for example, the overlying logic dies. The digital control blocks have the function of determining when the analog circuits need to pump currents. The digital control blocks, when used in advanced IVR, can determine how many phases of the analog pumps need to be turned on in order to optimize current output to the overlying device dies. In addition, device dies 24 may also include inductors 30 electrically coupled to the analog pump circuits and the digital control blocks. The IVR circuit may also include voltage drop detection circuits, which reside in device dies 52 (including 52A, 52B, and 52C, FIG. 9). The voltage drop detection circuits are used by overlying device dies 52 (FIG. 8) to detect voltage drop, digitize, and feedback to the analog pump circuits in device dies 24.

In accordance with some embodiments of the present disclosure, device dies 24 are stand-alone IVR dies, wherein no other logic circuits other than those are used by voltage regulator circuits are built in device dies 24. In accordance with alternative embodiments, some logic circuits or memory circuits are built inside device dies 24 along with the voltage regulator circuits.

Device dies 24 include semiconductor substrates 28, which may be silicon substrates, silicon carbon substrates, III-V compound semiconductor substrates, or the like. Device dies 24 also include interconnect structures 32. In accordance with some embodiments of the present disclosure, interconnect structure 32 includes a plurality of dielectric layers 34, and metal lines and vias (not shown) in dielectric layers 34. Dielectric layers 34 may include Inter-Metal Dielectric (IMD) layers, which may be formed of low-k dielectric materials having dielectric constants (k values) lower than about 3.5, lower than about 3.0, or lower than about 2.5, for example. Also, close to the top surfaces of device dies 24, there may exist non-low-k passivation layers such as silicon nitride layers, silicon oxide layers, Un-doped Silicate Glass (USG) layers, and/or polymer layers. Furthermore, at the surface of interconnect structure 32 reside metal pillars 40 (including 40A and 40B) in a surface dielectric layer 34. Metal pillars 40 may be copper-containing pads, aluminum-containing pads, or the like. In accordance with some embodiments, the top surface of the top one of dielectric layers 34 is coplanar with the top surfaces of metal pillars 40. In accordance with some embodiments, a portion of surface dielectric layer 34 covers metal pillars 40. The surface dielectric layer 34 may be a polymer layer, which may be formed of polybenzoxazole (PBO), for example.

Inductors 30 are embedded in interconnect structures 32, and are also parts of the voltage regulator circuits. Inductors 30 may be formed using metal lines and vias connected to have a shape of coils. Accordingly, in accordance with some embodiments of the present disclosure, inductors 30 are on-chip inductors integrated in the same chips as the IVR circuits. In accordance with alternative embodiments of the present disclosure, inductors 30 are formed outside of IVR dies 24 as stand-alone inductors.

Figure 7:
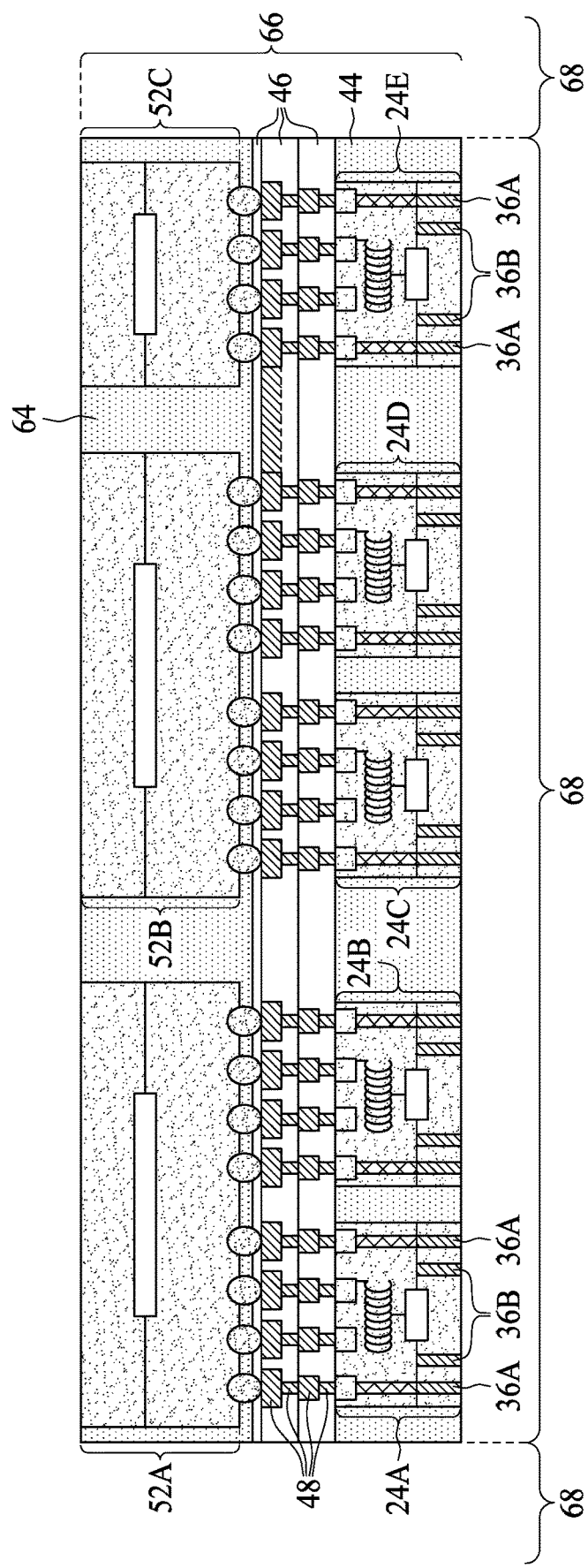

Device dies 24 also include through-vias (alternatively referred to as through-silicon vias or through-substrate vias) 36 (include 36A and 36B). It is appreciated that although through-vias 36 are illustrated as penetrating through the semiconductor substrates 28 in FIG. 2, through-vias 36 may not extend to the bottom surface of semiconductor substrate 28 at the time device dies 24 are placed over carrier 20. Rather, through-vias 36 extend to an intermediate level between the top surface and the bottom surface of semiconductor substrate 28, and the bottom ends of through-vias 36 will be revealed in a subsequent backside grinding step as illustrated in FIG. 7. Each of through-vias 36 is electrically insulated from the respective semiconductor substrates 28 by a dielectric layer (not shown) that encircles the respective through-via 36.

Figure 8:
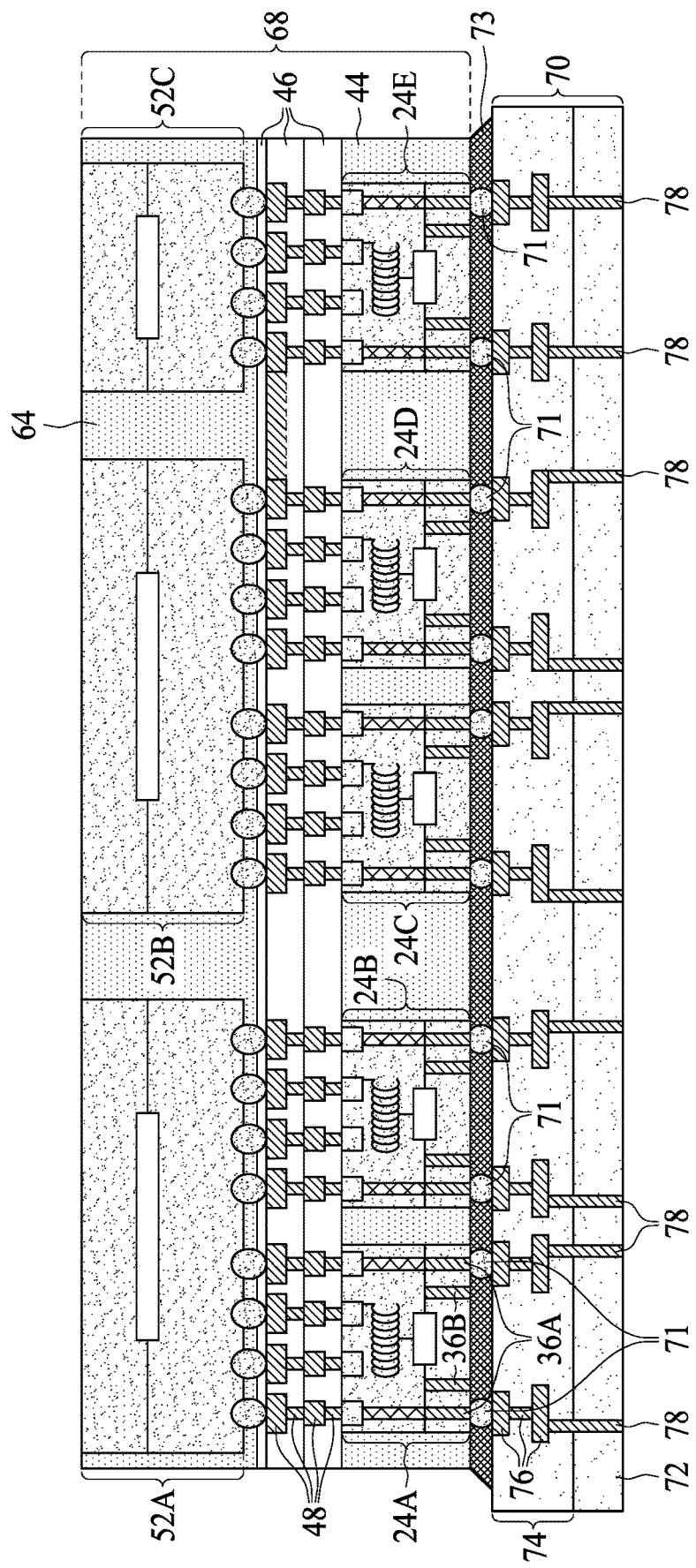

Through-vias 36A and 36B are used to connect the conductive features over semiconductor substrate 28 to the conductive features underlying the respective semiconductor substrate 28. Through-vias 36B are electrically coupled to the devices (such as the IVR circuits, conductive lines, inductor 30, etc.) inside the respective device dies 24. Through-vias 36B may also be electrically coupled to metal pillars 40B. Through-vias 36A in a device die 24, on the other hand, are solely used for connecting the conductive features (such as in device dies 52 in FIG. 8) over the respective device die 24 to the conductive features (such as metal pads in interposer 70 in FIG. 8) underlying device die 24. Through-vias 36A are not connected to any other circuits (including active devices such as transistors and diodes and passive devices such as capacitors, inductors, resistors, etc.) inside device die 24. Accordingly, through-vias 36A are used for interconnecting the features outside of device dies 24, and are not used for the inner connection to the circuits inside device dies 24. Alternatively stated, through-vias 36A has the same function as through-molding vias (not shown) that otherwise can be built outside of device dies 24 and penetrating through encapsulating material 44 (FIG. 8). However, forming through-vias 36A inside device dies 24 has no additional manufacturing cost since they are formed simultaneously as through-vias 36B, unlike the through-molding vias. In addition, since through-vias 36A are formed using the technology for forming device dies, through-vias 36 may have much higher density and smaller sizes than the through-molding vias, and the total count of through-vias 36A may be much higher than through-molding vias.

As shown in FIG. 2, each of through-vias 36A is connected to one of conductive paths 38, which electrically couples the respective through-vias 36A to a metal pillar 40A. Conductive path 38 may be a single-route path that has no branches/forks, and is not connected to any other metal pillar 40B, inductor, resistor, capacitor, transistors, diodes etc., in the respective device die 24. Accordingly, through-vias 36A, although residing in device dies 24, are not involved in the voltage/signal transferring that is related to voltage regulation. Also, although conductive paths 38 are illustrated as being straight paths, they may include horizontal metal lines. An advantageous feature of using through-vias 36A (and conductive paths 38) to replace the through-molding vias is that conductive paths 38 has the re-routing function, and metal pillars 40A do not have to overlap the respective through-vias 36A, while the through-molding vias are straight and vertical, and cannot be re-routed.

Figure 3:
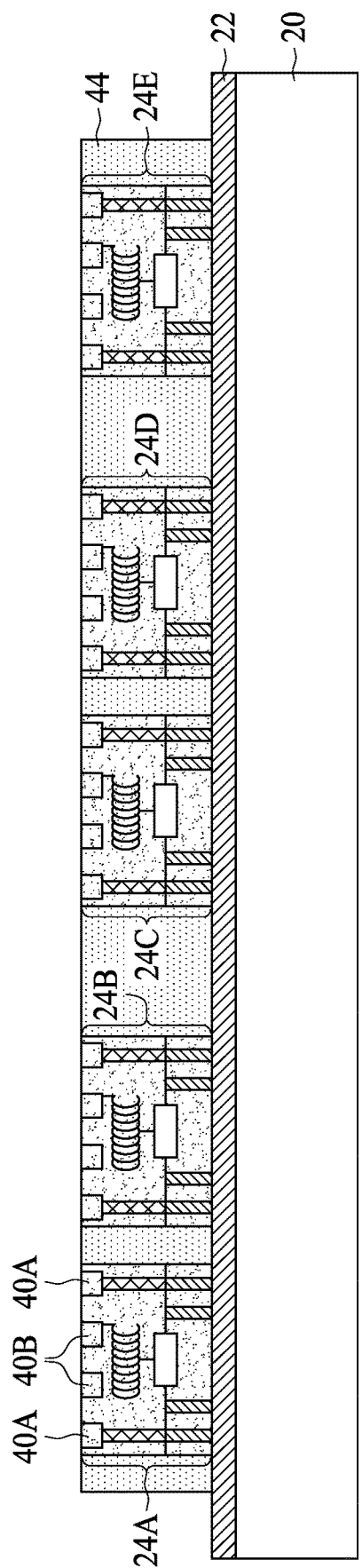

Referring to FIG. 3, encapsulating material 44 is encapsulated on device dies 24. The respective step is shown as step 204 in the process flow shown in FIG. 11. Encapsulating material 44 is dispensed and then cured, for example, in a thermal curing process. Encapsulating material 44 fills the gaps between device dies 24, and may be in contact with adhesive layer 22. Encapsulating material 44 may include a molding compound, a molding underfill, an epoxy, and/or a resin. After the encapsulation process, the top surface of encapsulating material 44 is higher than the top ends of metal pillars 40.

Next, a planarization step such as a Chemical Mechanical Polish (CMP) step or a grinding step is performed to planarize encapsulating material 44, until metal pillars 40 of device dies 24 are exposed. The respective step is shown as step 206 in the process flow shown in FIG. 11. The resulting structure is shown in FIG. 3. Due to the planarization, the top surfaces of metal pillars 40 are substantially level (coplanar) with the top surface of encapsulating material 44.

Figure 4:
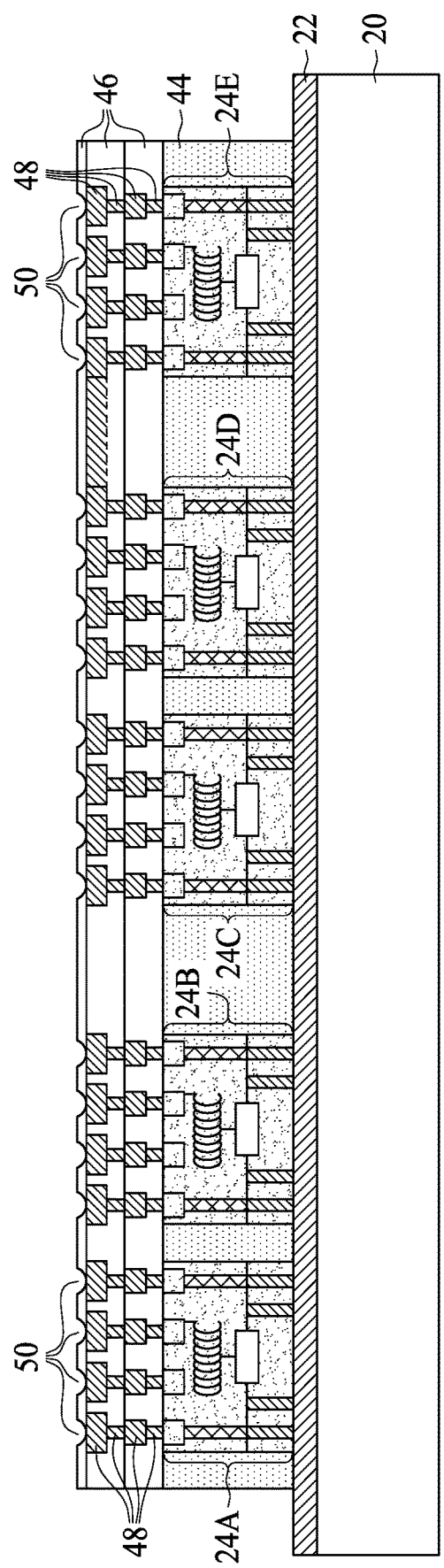

Referring to FIG. 4, one or more layers of dielectric layers 46 and the respective Redistribution Lines (RDLs) 48 are formed over encapsulating material 44 and device dies 24. The respective step is shown as step 208 in the process flow shown in FIG. 11. In accordance with some embodiments of the present disclosure, dielectric layers 46 are formed of a polymer(s) such as PBO, polyimide, or the like. In accordance with alternative embodiments of the present disclosure, dielectric layers 46 are formed of an inorganic dielectric material(s) such as silicon nitride, silicon oxide, silicon oxynitride, or the like.

RDLs 48 are formed to electrically couple to metal pillars 40. RDLs 48 may include metal traces (metal lines) and vias underlying and connected to the respective metal traces. In accordance with some embodiments of the present disclosure, RDLs 48 are formed through plating processes, wherein each of RDLs 48 includes a seed layer (not shown) and a plated metallic material over the seed layer. The seed layer and the plated metallic material may be formed of the same material or different materials.

During the formation of RDLs 48, dielectric layers 46 are patterned to form via openings (occupied by RDLs 48), and upper-level RDLs 48 extend into the via openings to contact lower-level RDLs 48 or metal pillars 40. In addition, some of RDLs 48 may electrically interconnect device dies 24. The top dielectric layer 46 may be patterned (for example, using laser) to form openings 50 therein, so that some metal pads in RDLs 48 are exposed.

Figure 5:
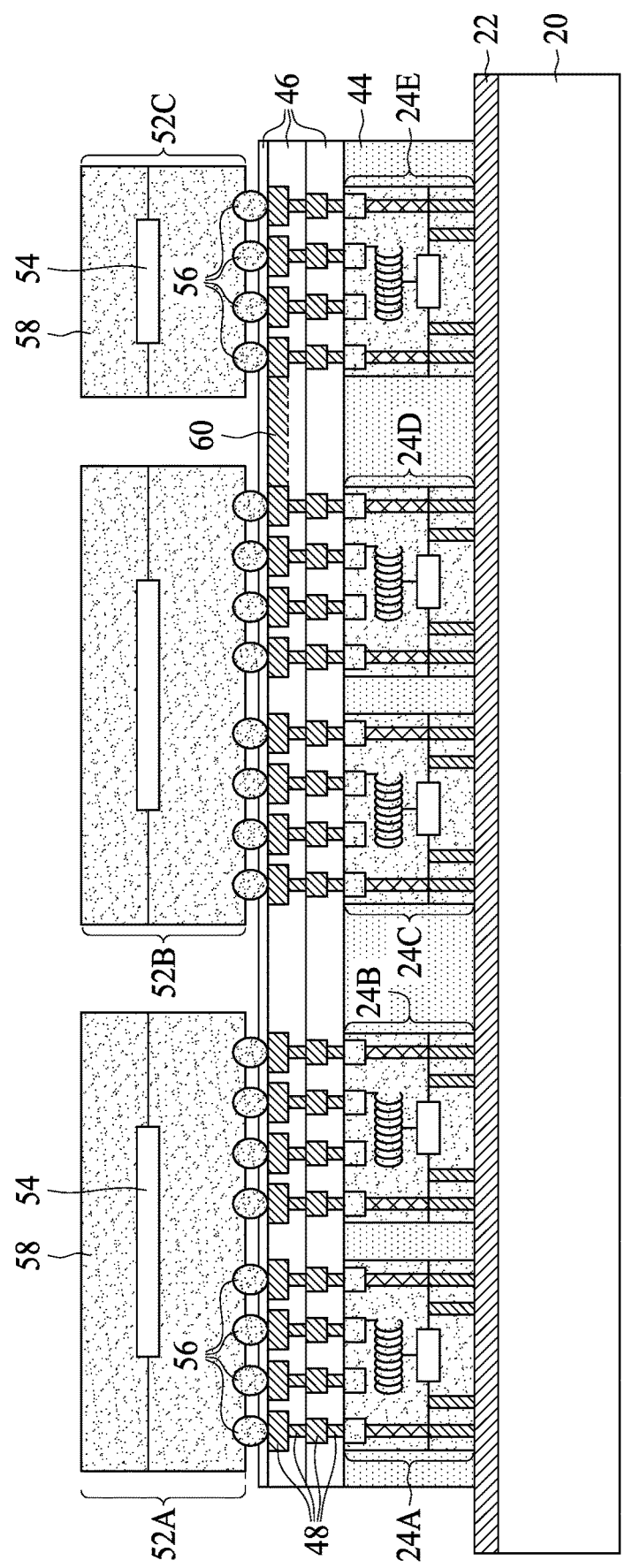

FIG. 5 illustrates the bonding of device dies 52 (including 52A, 52B, and 52C) onto the exposed metal pads in RDLs 48. The respective step is shown as step 210 in the process flow shown in FIG. 11. Throughout the description, device dies 52 are also referred to as tier-2 dies. Device dies 52 may be bonded to metal pads 48 through solder regions 56. Each of device dies 52 may include semiconductor substrate 58 having its back surface facing up. Device dies 52 further include integrated circuit devices 54 (such as active devices, which include transistors, for example, not shown) at the front surface (the surface facing down) of semiconductor substrate 58. Device dies 52A and 52B may include logic dies such as Central Processing Unit (CPU) dies, Graphic Processing Unit (GPU) dies, mobile application dies, or the like. Device dies 52A and 52B may be identical to each other. Device die 52C may be a (high speed) Input/output (IO) die, which is used for the input/output of device dies 52A and 52B. RDL 60, which is illustrated using a dashed line, represents the electrical connection between devices dies 52A and 52B to IO die 52C.

In accordance with some embodiments in which device dies 52A and 52B are CPU dies, integrated circuits 54 may include plurality of functional circuits such as a control unit, memory components, clock circuitry, pad transceiver circuitry, a logic gate cell library, etc. The control unit controls the data paths of the CPU. The memory components include register files, caches (SRAM cells), etc. The Clock circuitry includes clock drivers, Phase-Locked Loops (PLLs), clock distribution networks, or the like. The logic gate cell library is used to implement logic.

Device die 52A is electrically connected to device dies 24A and 24B. In addition, device dies 24A and 24B regulate the voltage supplies for device die 52A. Device die 52B is connected to device dies 24C and 24D. In addition, device dies 24C and 24D regulate the voltage supply for device die 52B. Each of device dies 52A and 52B may include a plurality of cores, and device dies 52A and 52B are alternatively referred to core chips. Device die 52C, which may be an IO chip, is connected to device die 24E, with device die 24E regulating the voltages for IO chip 52C. In accordance with some embodiments of the present disclosure, device dies 52A fully overlaps device dies 24A and 24B. Device die 52A may also extend laterally beyond the edges of device dies 24A and 24B. Device dies 52B fully overlaps device dies 24C and 24D. Device die 52B may also extend laterally beyond the edges of the device dies 24C and 24D.

Figure 6:
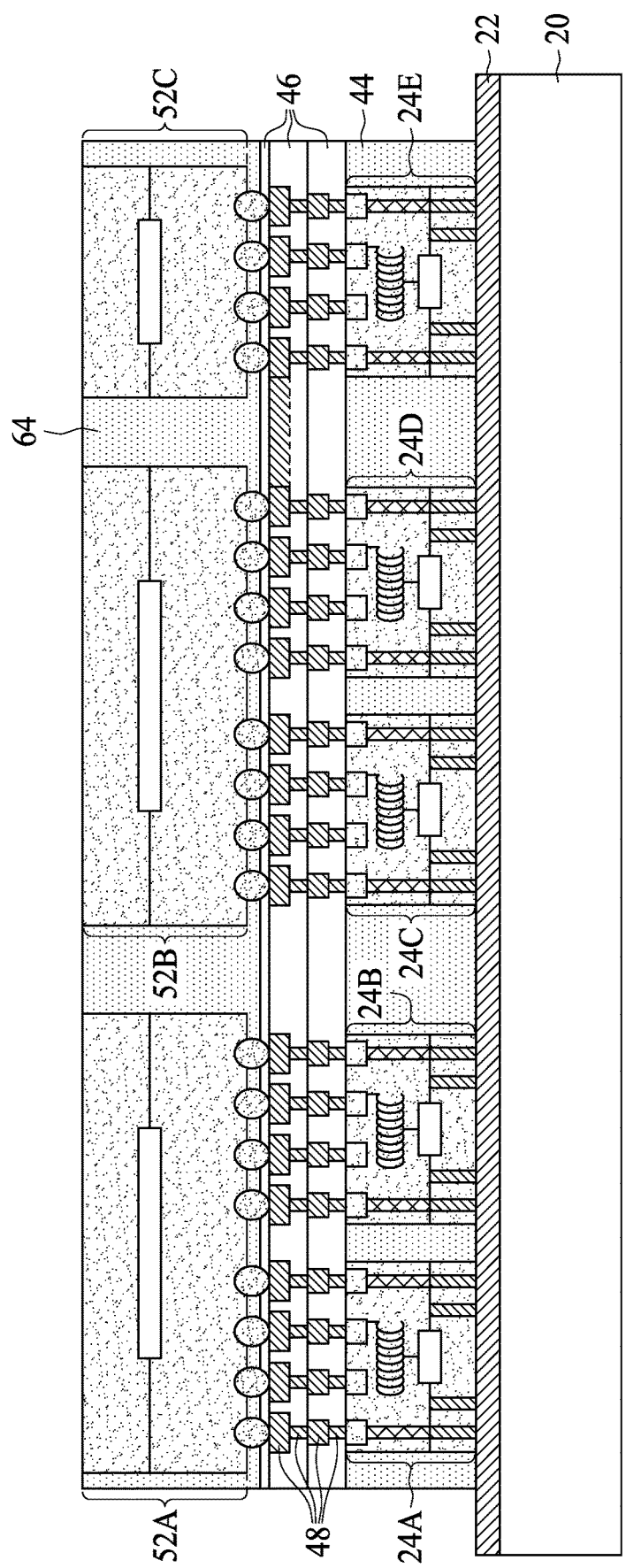

Referring to FIG. 6, encapsulating material 64 is encapsulated on device dies 52. The respective step is shown as step 212 in the process flow shown in FIG. 11. Encapsulating material 64 may include a molding compound, a molding underfill, an epoxy, or a resin. The bottom surface of encapsulating material 64 physically contacts the top surface of the top dielectric layer 46. After the dispensing, encapsulating material 64 is cured, for example, in a thermal curing process. In accordance with some embodiments of the present disclosure, a planarization step is performed to planarize encapsulating material 64, until the top surface of encapsulating material 64 is coplanar with the top surfaces of device dies 52. The respective step is shown as step 214 in the process flow shown in FIG. 11. In accordance with alternative embodiments of the present disclosure, no planarization is performed, and in the final structure, encapsulating material 64 includes some portions overlapping device dies 52. Throughout the description, the structure overlying layer 22 is referred to as package 66, which includes a plurality of package, each including device dies 24A, 24B, 24C, 24D, 24E, and 52A, 52B, and 52C.

Next, package 66 is de-bonded from carrier 20. The respective step is shown as step 216 in the process flow shown in FIG. 11. The resulting structure is shown in FIG. 7. The de-bonding of package 66 from carrier 20 is performed, for example, by projecting a UV light or a laser on adhesive layer 22. For example, when adhesive layer 22 is formed of LTHC, the heat generated from the UV light or laser causes the LTHC to be decomposed, and hence carrier 20 is detached from package 66. A backside grinding is performed to grind the bottom portions of device dies 24 and encapsulating material 44. The backside grinding is performed until the bottom ends of through-vias 36A and 36B are exposed. In accordance with some embodiments, metal pads and/or metal traces (not shown) are formed at the bottom of device dies 24 to electrically connect to through-vias 36A and 36B. In accordance with alternative embodiments, no metal pads and/or metal traces are formed at the bottom of device dies 24.

In a subsequent step, die-saw is performed to saw package 66 into discrete packages 68, which are identical to each other, with one of discrete packages 68 illustrated in FIG. 8. The respective step is also shown as step 216 in the process flow shown in FIG. 11.

Since package 68 is sawed from package 66, the edges of encapsulating material 44 are vertically aligned to the respective edges of encapsulating material 64. Furthermore, the edges of encapsulating material 44 are also vertically aligned to the respective edges of dielectric layers 46.

Further referring to FIG. 8, package 68 is bonded to interposer 70. In accordance with some exemplary embodiments, the bonding is performed through solder regions 71. In accordance with alternative embodiments, other bonding methods such as hybrid bonding may be used. The respective step is shown as step 218 in the process flow shown in FIG. 11. The bonding may be a Chip-on-Wafer (CoW) bonding, wherein a plurality of packages (chips) 68 is bonded to the same interposer wafer including a plurality of interposers that are the same as the illustrated interposer 70. In accordance with some embodiments of the present disclosure, an interconnect structure (not shown), which is essentially the same as interconnect structure 84 in FIG. 10, may be formed at the bottom of package 68, wherein the RDLs in the interconnect structure are electrically coupled to through-vias 36A and 36B. Interposer 70 may include semiconductor substrate 72 (which may be a silicon substrate) and interconnect structure 74 over semiconductor substrate 72. Metal lines and vias 76 are formed in interconnect structure 74. Through-vias 78 are formed in semiconductor substrate 72. Interposer 70 is free from active devices such as transistors and diodes. Interposer 70 may be free from, or may include, passive devices (not shown) such as resistors, inductors, capacitors, or the like. Underfill 73 may be dispensed between package 68 and interposer 70. The interposer wafer may then be sawed apart into a plurality of packages, each including interposer 70 and the overlying device dies 24 and 52.

Figure 9:
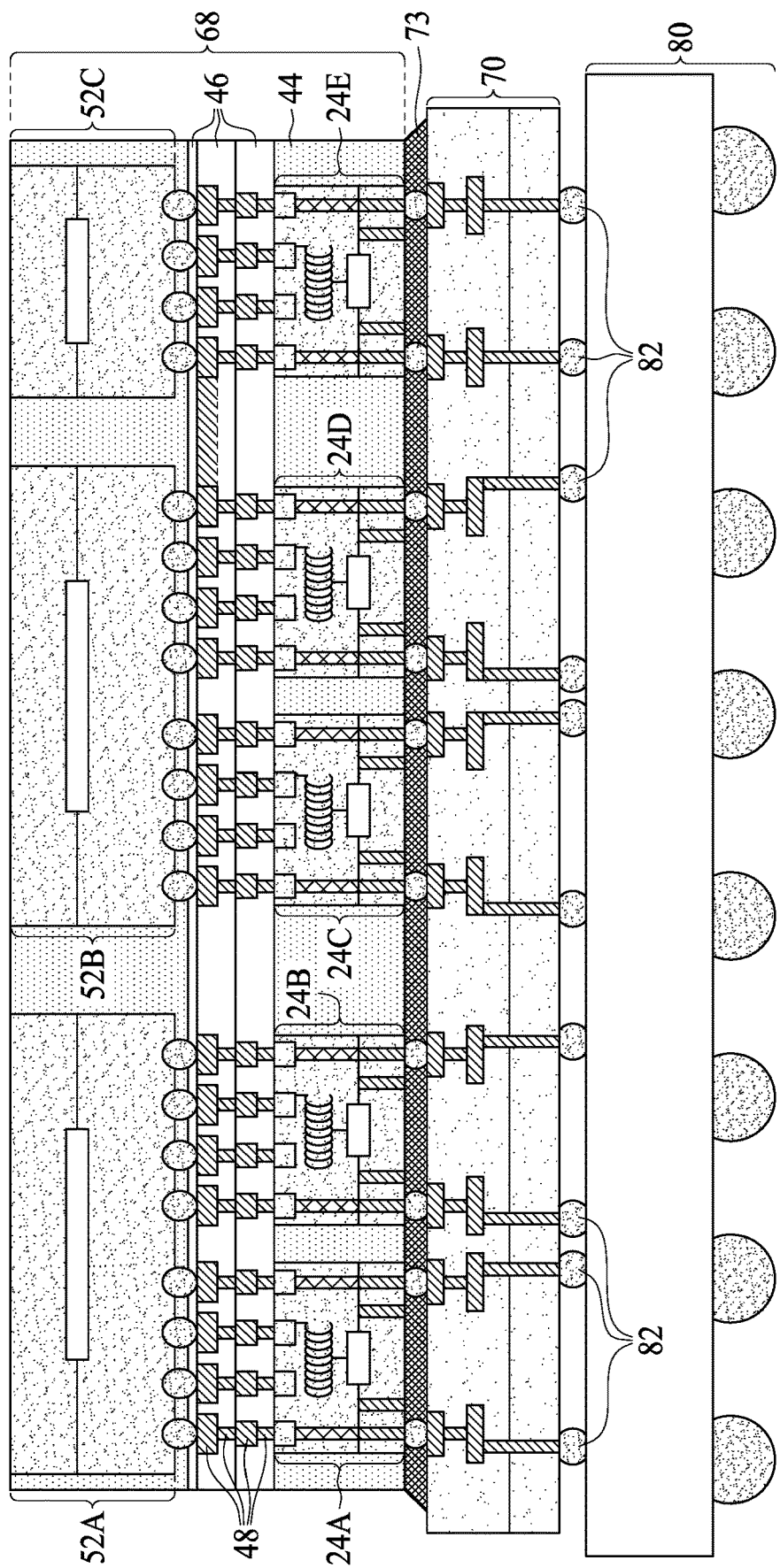

Referring to FIG. 9, interposer 70 is bonded to package substrate 80, for example, through solder regions 82. The respective step is shown as step 220 in the process flow shown in FIG. 11. Package substrate 80 may be a laminate substrate (core-less) or may have cores. The conductive traces and/or cores (not shown) in package substrate 80 are electrically connected to solder regions 82. Package substrate 80 may have a top-view area greater than the top-view area of the overlying interposer 70.

Figure 10:
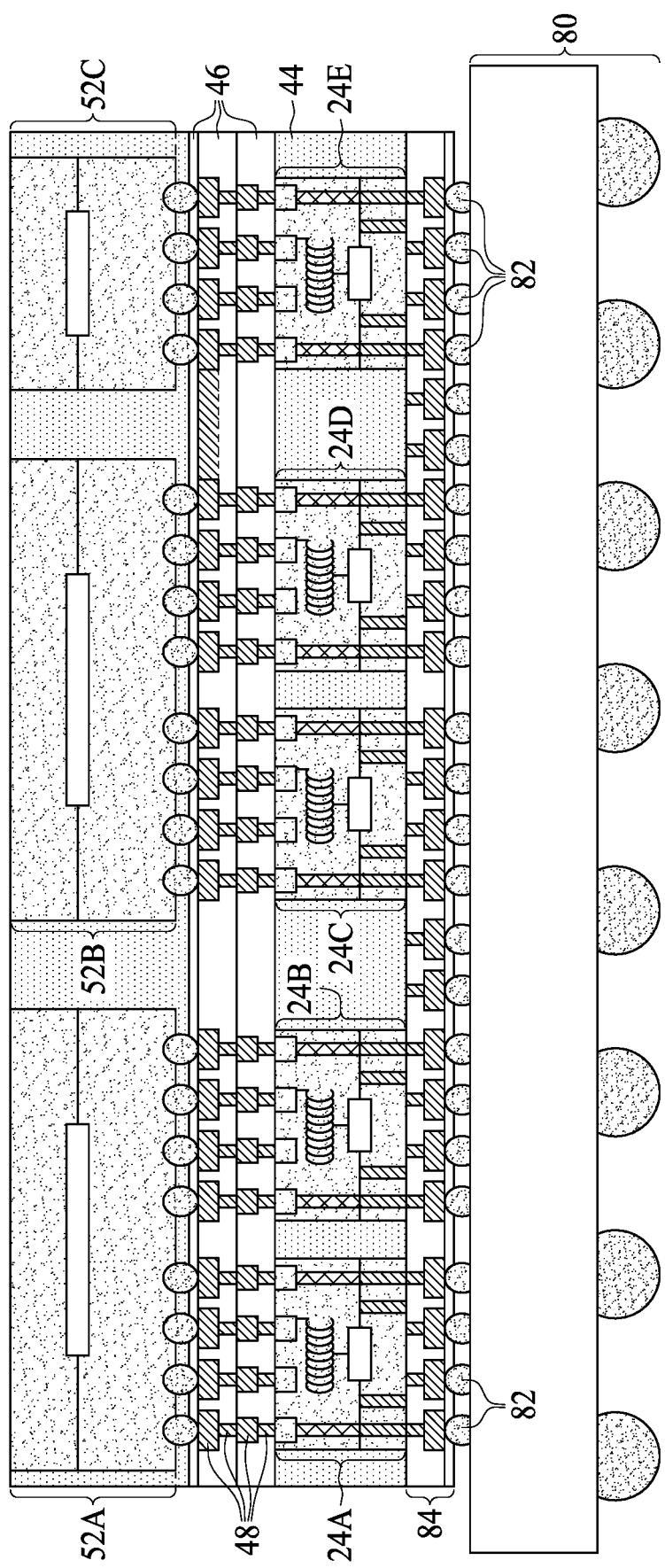
FIG. 10 illustrates a cross-sectional view of a package including integrated voltage regulators in accordance with some embodiments.

FIG. 10 illustrates the package in accordance with alternative embodiments. These embodiments are similar to the embodiments in FIG. 9, except that no interposer is used, and package 68 is bonded to package substrate 80 directly. In accordance with some embodiments of the present disclosure, package 68 includes interconnect structure 84 that is formed at the bottom surface of device dies 24 and encapsulating material 44. Interconnect structure may be formed using essentially the same methods and materials for forming dielectric layers 46 and RDLs 48, and hence the details are not repeated herein.

The embodiments of the present disclosure have some advantageous features. As shown in FIG. 9 or 10, device die 52A may have a top-view area greater than the total top-view area of device dies 24A and 24B. Accordingly, device dies 24A and 24B may be placed directly underlying the respective core chip 52A, and the total top-view area of device dies 24A, 24B, and 52A is essentially the top-view area of device die 52A. By placing IVR dies (such as 24A and 24B) directly underlying its corresponding core device die (such as 52A), the distance from the core device die to its voltage regulators is minimized. Similarly, by placing IVR die 24E directly underlying device die 52C, the distance from device die 52C to its voltage regulator in IVR die 24E is minimized. The power efficiency is thus improved. As a comparison, if IVR dies are placed aside of the core chips, the layout is unbalanced since the IVR dies are closer to some of the cores in core chips and farther away from other cores in the core chips. By placing IVR dies 24 directly underlying the core chips that the IVR dies 24 serve, the layout is balanced.

In addition, since device dies 24 are small, the through-molding vias that otherwise will be formed (if the embodiments of the present disclosure are not used) to connect interposer 70/package substrate 80 to device dies 52 can be replaced by through-vias 36A. This eliminates the cost for forming the through-molding vias, while essentially there is no production cost for forming through-vias 36A (since through-vias 36A are formed simultaneously as through-vias 36B). Also, IVR dies 24 typically have a low density of metal lines and vias in their interconnect structures. Accordingly, the interconnect structure of the IVR dies may be used for forming embedded inductors.

In accordance with some embodiments of the present disclosure, a package includes an IVR die, wherein the IVR die includes metal pillars at a top surface of the first IVR die. The package further includes a first encapsulating material encapsulating the first IVR die therein, wherein the first encapsulating material has a top surface coplanar with top surfaces of the metal pillars. A plurality of redistribution lines is over the first encapsulating material and the IVR die. The plurality of redistribution lines is electrically coupled to the metal pillars. A core chip overlaps and is bonded to the plurality of redistribution lines. A second encapsulating material encapsulates the core chip therein, wherein edges of the first encapsulating material and respective edges of the second encapsulating material are vertically aligned to each other. An interposer or a package substrate is underlying and bonded to the IVR die.

In accordance with some embodiments of the present disclosure, a package includes a first IVR and a second IVR die, each including metal pillars, voltage regulator circuits electrically coupled to the metal pillars, and an inductor electrically coupled to the voltage regulator circuits. A first encapsulating material encapsulates the first IVR die and the second IVR die therein. The first encapsulating material has a top surface coplanar with top surfaces of the metal pillars in the first IVR die and the second IVR die. A dielectric layer overlaps the first IVR die, the second IVR die, and the first encapsulating material. A plurality of redistribution lines includes portions in the dielectric layer. The plurality of redistribution lines is electrically coupled to the first IVR die and the second IVR die. A first CPU chip and a second CPU chip overlap and are electrically coupled to the first IVR die and the second IVR die, respectively. A second encapsulating material encapsulates the first CPU chip and the second CPU chip therein.

In accordance with some embodiments of the present disclosure, a package includes a first device die, which includes a semiconductor substrate, a first through-via and a second through-via penetrating through the semiconductor substrate, an active circuit at a surface of the semiconductor substrate, a first metal pillar at a top surface of the first device die, and a second metal pillar at a top surface of the first device die. The first metal pillar is electrically coupled to the active circuit and the first through-via. The second metal pillar is electrically coupled to the second through-via, and is electrically decoupled from all active circuits in the first device die. The package further includes a first encapsulating material encapsulating the first device die therein, and a second device die overlapping and electrically coupled to the first device die. A package component is underlying and bonded to the device die. The second through-via and the second metal pillar electrically couple the package component to the second device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first Integrated Voltage Regulator (IVR) die;
   a first encapsulant encapsulating the first IVR die therein;
   a dielectric layer over the first IVR die and the first encapsulant;
   a plurality of redistribution lines extending into the dielectric layer, wherein plurality of redistribution lines are electrically coupled to the first IVR die;
   a device die overlapping the plurality of redistribution lines, wherein the device die are electrically coupled to the first IVR die through a portion of the plurality of redistribution lines; and
   a second encapsulant encapsulating the device die therein, wherein corresponding edges of the first encapsulant, the dielectric layer, and the second encapsulant are flush with each other.

2. The package of claim 1 further comprising an interposer underlying and bonding to the first IVR die, wherein the interposer extends laterally beyond edges of the first encapsulant.

3. The package of claim 1, wherein the first encapsulant and the second encapsulant comprise molding compounds.

4. The package of claim 1 further comprising a second IVR die in the first encapsulant, wherein the device die is electrically coupled to, and overlaps, both of the first IVR die and the second IVR die.

5. The package of claim 1, wherein the first IVR die comprises:
   a semiconductor substrate; and
   a through-via penetrating through the semiconductor substrate, wherein the through-via is electrically coupled to the device die.

6. The package of claim 5, wherein the first IVR die comprises a plurality of active devices, and wherein the through-via is electrically decoupled from all active devices in the first IVR die.

7. The package of claim 6 further comprising an inductor in the first IVR die, wherein the through-via is electrically decoupled from all passive devices in the first IVR die, with the all passive devices comprising the inductor.

8. The package of claim 1, wherein the first IVR die comprises a bond pad, and wherein top surfaces of the bond pad and the first encapsulant are coplanar.

9. The package of claim 1, wherein the first IVR die is configured to provide power to the device die.

10. A package comprising:
    a first Integrated Voltage Regulator (IVR) die comprising:
      a voltage regulator circuit; and
      an inductor electrically coupling to the voltage regulator circuit;
    a first encapsulating material encapsulating the first IVR die therein;
    an interposer underlying and bonding to the first IVR die, wherein the interposer comprises a silicon substrate, and a through-via penetrating through the silicon substrate;
    a dielectric layer overlapping and in physical contact with both of the first IVR die and the first encapsulating material, wherein first edges of the dielectric layer are flushed with corresponding second edges of the first encapsulating material, and wherein the interposer laterally extends beyond the corresponding second edges of the first encapsulating material;
    a plurality of redistribution lines extending into the dielectric layer;
    a first chip overlying and electrically coupling to the first IVR die through a portion of the plurality of redistribution lines, wherein the first IVR die is configured to provide power to the first chip; and
    a second encapsulating material encapsulating the first chip, wherein the second encapsulating material further comprises third edges flush with the corresponding second edges of the first encapsulating material.

11. The package of claim 10 further comprising:
    a second IVR die in the first encapsulating material; and
    an additional redistribution line between the first encapsulating material and the second encapsulating material, wherein the additional redistribution line electrically couples the first IVR die to the second IVR die.

12. The package of claim 11 further comprising:
    a second chip over and electrically coupling to the second IVR die.

13. The package of claim 10, wherein the first IVR die further comprises a device selected from the group consisting of an analog pump circuit, a digital control block, and combinations thereof.

14. The package of claim 10, wherein the first IVR die further comprises:
    a semiconductor substrate, wherein the inductor is over the semiconductor substrate; and
    an additional through-via penetrating through the semiconductor substrate, wherein the additional through-via electrically couples the first chip to the interposer.

15. A package comprising:
    a first device die comprising an Integrated Voltage Regulator (IVR), the first device die comprising:
      a semiconductor substrate;
      a first through-via penetrating through the semiconductor substrate;
      an active circuit at a surface of the semiconductor substrate; and
      a metal pillar at a top surface of the first device die;
    a first molding compound molding the first device die therein;
    a second device die overlapping and electrically coupling to the first device die;
    a second molding compound molding the second device die therein, wherein the first molding compound is physically spaced apart from the second molding compound, and wherein corresponding edges of the first molding compound and the second molding compound are flush with each other; and
    a package component underlying and bonding to the first device die.

16. The package of claim 15 further comprising:
    a plurality of dielectric layers, wherein a top layer in the plurality of dielectric layers is underlying and contacting the second molding compound, and a bottom layer in the plurality of dielectric layers is overlying and contacting the first molding compound, and wherein edges of the plurality of dielectric layers are flush with the corresponding edges of the first molding compound and the second molding compound.

17. The package of claim 15, wherein the second device die is a core device die receiving regulated power from the first device die.

18. The package of claim 15 further comprising a third device die in the first molding compound, wherein the third device die comprises an additional IVR circuit, and wherein both of the first device die and the third device die are configured to provide power to the second device die.

19. The package of claim 15, wherein the first through-via is electrically decoupled from all active circuits in the first device die.

20. The package of claim 19 further comprising a second through-via penetrating through the semiconductor substrate, wherein the second through-via is electrically coupled to an active circuit in the first device die.

* * * * *